(12) United States Patent
Shao

(10) Patent No.: US 9,728,536 B2
(45) Date of Patent: Aug. 8, 2017

(54) SEMICONDUCTOR DEVICES

(71) Applicant: Semiconductor Manufacturing International (Shanghai) Corporation, Shanghai (CN)

(72) Inventor: Qun Shao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/196,972

(22) Filed: Jun. 29, 2016

(65) Prior Publication Data

US 2016/0307897 A1    Oct. 20, 2016

Related U.S. Application Data

(62) Division of application No. 14/691,037, filed on Apr. 20, 2015, now Pat. No. 9,406,677.

(30) Foreign Application Priority Data

May 15, 2014  (CN) .......................... 2014 1 0206055

(51) Int. Cl.
*H01L 21/70* (2006.01)
*H01L 27/092* (2006.01)
*H01L 29/66* (2006.01)
*H01L 29/49* (2006.01)
*H01L 21/8238* (2006.01)
(Continued)

(52) U.S. Cl.
CPC ...... *H01L 27/092* (2013.01); *H01L 21/02164* (2013.01); *H01L 21/02238* (2013.01); *H01L 21/0332* (2013.01); *H01L 21/28079* (2013.01); *H01L 21/31053* (2013.01); *H01L 21/31116* (2013.01); *H01L 21/32* (2013.01); *H01L 21/3212* (2013.01); *H01L 21/32135* (2013.01); *H01L 21/32136* (2013.01); *H01L 21/823828* (2013.01); *H01L 21/823842* (2013.01); *H01L 29/495* (2013.01); *H01L 29/66545* (2013.01); *H01L 21/823456* (2013.01)

(58) Field of Classification Search
CPC ................... H01L 21/02164; H01L 21/02238
See application file for complete search history.

(56) References Cited

U.S. PATENT DOCUMENTS 6,376,888 B1 *  4/2002  Tsunashima .................. 257/390
7,981,801 B2    7/2011  Chuang et al.
(Continued)

*Primary Examiner* — Bradley K Smith
(74) *Attorney, Agent, or Firm* — Anova Law Group, PLLC

(57) ABSTRACT

A method for fabricating a semiconductor device includes providing a semiconductor substrate having a first region and a second region; and forming at least one first dummy gate in the first region and at least one second dummy gate in the second region. Further, the method includes forming a dielectric layer with a top surface leveling with a surface of the first dummy gate on the semiconductor substrate; oxidizing a top portion of the second dummy gate to form a protective layer to prevent over-polishing on the second region; removing the first dummy gate to form a first gate trench; forming a first metal layer to fill the first gate trench and cover the protective layer and the dielectric layer; and removing a portion of the first metal layer higher than the dielectric layer to form a first metal gate in the first gate trench.

8 Claims, 10 Drawing Sheets

(51) Int. Cl.
   *H01L 21/02* (2006.01)
   *H01L 21/3105* (2006.01)
   *H01L 21/32* (2006.01)
   *H01L 21/3213* (2006.01)
   *H01L 21/321* (2006.01)
   *H01L 21/311* (2006.01)
   *H01L 21/033* (2006.01)
   *H01L 21/28* (2006.01)
   H01L 21/8234 (2006.01)

(56) References Cited

U.S. PATENT DOCUMENTS

| | | |
|---|---|---|
| 2011/0266637 A1 | 11/2011 | Lee et al. |
| 2012/0080755 A1 | 4/2012 | Kim |
| 2013/0164930 A1 | 6/2013 | Tu et al. |
| 2014/0001540 A1* | 1/2014 | Wang ................ H01L 29/66666 257/329 |

* cited by examiner

SEMICONDUCTOR DEVICES

CROSS REFERENCE TO RELATED APPLICATIONS

This application is a divisional of U.S. patent application Ser. No. 14/691,037, filed on Apr. 20, 2015, which claims the priority of Chinese patent application No. 201410206055.8, filed on May 15, 2014, the entirety of all of which is incorporated herein by reference

FIELD OF THE INVENTION

The present invention generally relates to the field of semiconductor manufacturing technology and, more particularly, relates to semiconductor devices and fabrication processes thereof.

BACKGROUND

With the rapid development of integrated circuit (IC) manufacturing technology, the critical dimension (CD) of metal-oxide-semiconductor (MOS) transistors has become smaller and smaller. When the CD of the MOS transistors is continually shrunk, in order to low the parasitic capacitance of the gates of the MOS transistors and increase the device speed, metal gates have been widely used in the MOS transistors.

FIGS. 1~7 illustrate semiconductor structures corresponding to certain stages of an existing fabrication method of PMOS transistors and NMOS transistors. As shown in FIG. 1, the method includes providing a semiconductor substrate 100 having an NMOS region I and a PMOS region II. A first dummy gate 101 and a third dummy gate 103 are formed on the semiconductor substrate 100 in the NMOS region I. Further, a second dummy gate 102 and a fourth dummy gate 104 are formed on the semiconductor substrate 100 in the PMOS region II. The CD of the first dummy gate 101 and the CD of the second dummy gate 102 are equal to or greater than 0.1 μm. The CD of the third dummy gate 103 is smaller than the CD of the first dummy gate 101. The CD of the fourth dummy gate 104 is smaller than the CD of the second dummy gate 102. The first dummy gate 101, the second dummy gate 102, the third dummy gate 103 and the fourth dummy gate 104 are all made of polysilicon.

Further, a silicon oxide layer 105 is formed on the semiconductor substrate 100, first dummy gate 101, the second dummy gate 102, the third dummy gate 103, and the fourth dummy gate 104. The top surface of the silicon oxide layer 105 levels with the top surfaces of the first dummy gate 101, the second dummy gate 102, the third dummy gate 103, and the fourth dummy gate 104.

Further, as shown FIG. 2, a patterned mask layer 106 is formed. The patterned mask layer 106 covers the silicon oxide layer 105 in the PMOS region II, the second dummy gate 102 and the fourth dummy gate 104. Then, the first dummy gate 101 and the third dummy gate 103 in the NMOS regions I are removed. Thus, a first gate trench 107 and a third gate trench 108 are formed in the silicon oxide layer 105 in the NMOS region II.

Further, as shown in FIG. 3, a first Al layer 109 is filled in the first gate trench 107 and the second gate trench 108. The first Al layer 109 also covers the patterned mask layer 106.

Further, as shown in FIG. 4, the portion of the first Al layer 109 higher than the silicon oxide layer 105, and the patterned mask layer 106 are removed by a chemical mechanical polishing (CMP) process. Thus, a first Al gate 110 is formed in the first gate trench 107; and a third Al gate 111 is formed in the third gate trench 108. The polishing slurry of the CMP process includes aluminum oxide particles.

Further, as shown in FIGS. 4~5, the second dummy gate 102 and the fourth dummy gate 104 in the PMOS region II are removed. Correspondingly, a second gate trench 112 and a fourth gate trench 113 are formed in the silicon oxide layer 105 in the PMOS region II.

Further, as shown in FIG. 6, a second Al layer 114 is filled in the second gate trench 112 and the fourth gate trench 113. The second Al layer 114 also covers the silicon oxide layer 105, the first Al gate 110 and the second Al gate 111 in the NMOS region I.

Further, as shown in FIG. 7, the portion of the second Al layer 114 higher than the surface of the silicon oxide layer 105 is removed by a CMP process. Thus, a second Al gate 115 is formed in the second gate trench 112; and a fourth Al gate 116 is formed in the fourth gate trench 113.

However, the performance of the PMOS transistors may be unable to match the desired requirements, or even worse, they may fail. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a semiconductor substrate having a first region and a second region; and forming at least one first dummy gate on the semiconductor substrate in the first region and at least one second dummy gate on the semiconductor substrate in the second region. Further, the method includes forming a dielectric layer with a top surface leveling with top surfaces of the first dummy gate and the second dummy gate on the semiconductor substrate; and oxidizing a top portion of the second dummy gate to form a protective layer to prevent over-polishing on the second region on the second dummy gate. Further, the method includes removing the first dummy gate to form a first gate trench; forming a first metal layer to fill the first gate trench and cover the protective layer and the dielectric layer in the second region; and removing a portion of the first metal layer higher than the dielectric layer to form a first metal gate in the first gate trench.

Another aspect of the present disclosure includes a semiconductor device. The semiconductor device includes a semiconductor substrate having a first region and a second region. The semiconductor device also includes at least one first metal gate formed on a surface of the semiconductor substrate in the first region. Further, the semiconductor device includes at least one second metal gate formed on the surface of the semiconductor substrate in the second region. Further, the method also includes a dielectric layer with a surface leveling with top surfaces of the first metal gate and the second metal gate formed on the surface of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
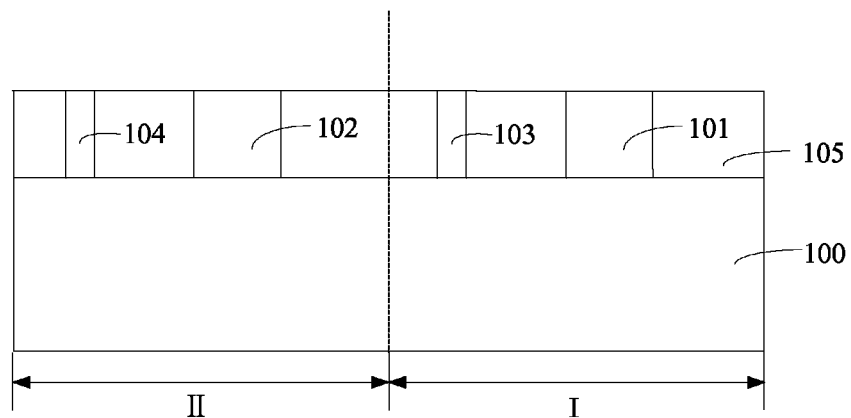
FIGS. 1~7 illustrate semiconductor structures corresponding to certain stages of an existing fabrication method of metal gates of a PMOS transistor and an NMOS transistor.
Figure 2:
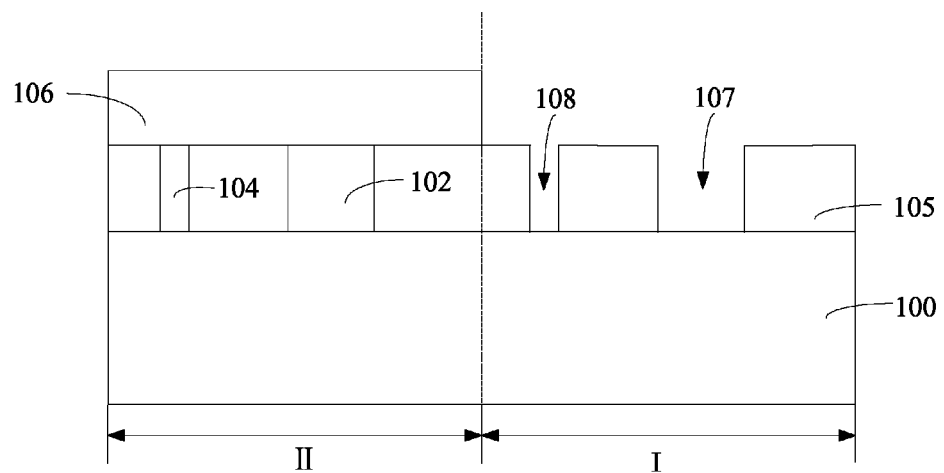
Figure 3:
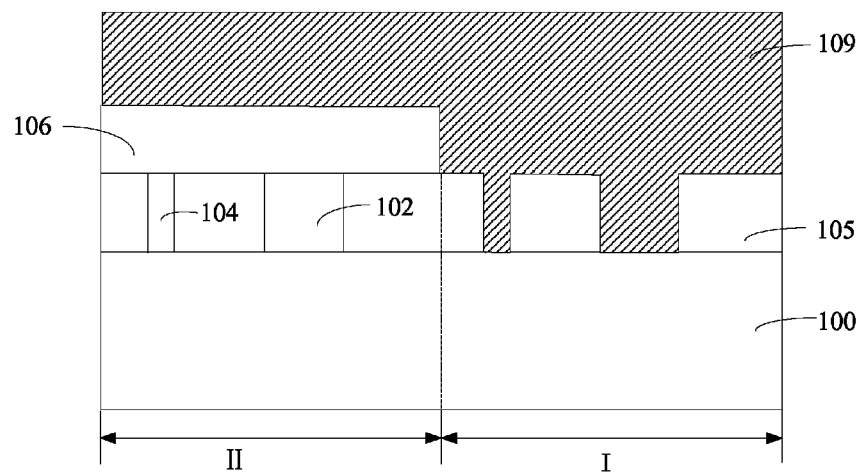
Figure 4:
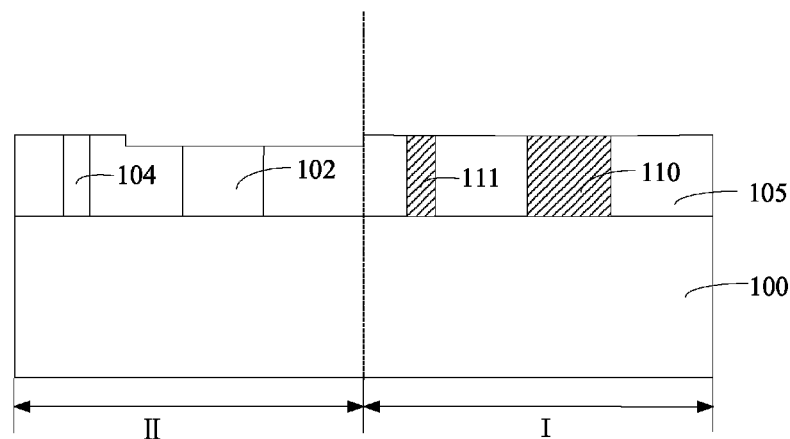

Referring to FIGS. 3~4, when the CMP process is used to remove the first Al layer 109 higher than the silicon oxide layer 105, the patterned mask layer 106 may be removed simultaneously. When the CMP process is performed onto the surface of the silicon oxide layer 105, the polishing slurry may have significantly larger polishing selective ratio to polysilicon than to silicon oxide. Such a condition may become more obvious for the second dummy gate 102 with a CD greater than or equal to 0.1 µm. Thus, under a same CMP process, the second dummy gate 102 may be polished relatively fast; and the silicon oxide layer 105 may be polished relatively slow.

When the CMP process is finished, the over polishing of the polishing slurry to the second dummy gate 102 may be significantly severe. It may also cause a severe over polishing to the silicon oxide layer 105 around the second dummy gate 102. Referring to FIG. 3, when the CMP process is used to polish the first Al layer 109 to expose the surface of the silicon oxide layer 105 to form the first Al gate 110 and the third Al gate 111, the over polishing may happen. The over polishing may cause the heights of the second dummy gate 102 and the portion of the silicon oxide layer 105 around the second dummy gate 102 to be obviously lower than the heights of the first Al gate 110 and the portion of the silicon oxide layer 105 around the first Al gate 110. Therefore, polishing dishes (not labeled) may be formed on the silicon oxide layer 105 in the PMOS region II.

Figure 5:
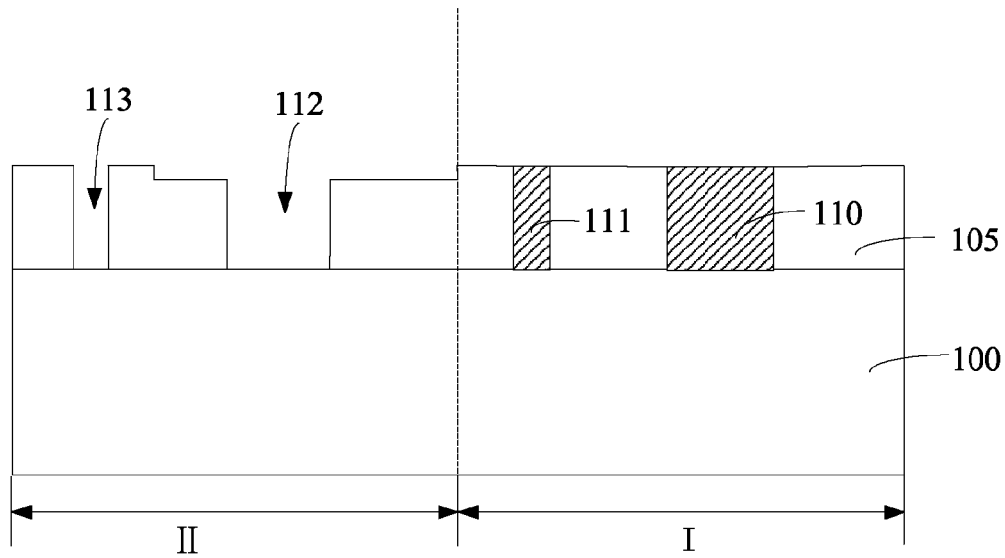
Figure 6:
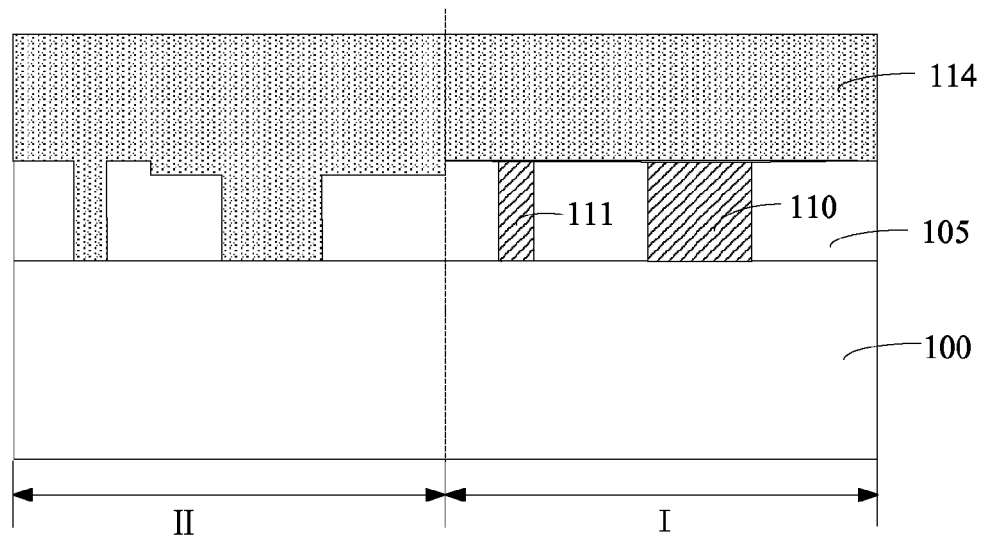
Figure 7:
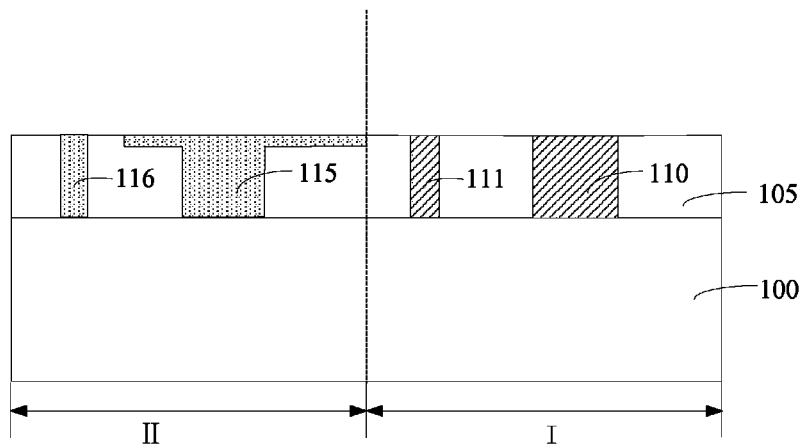

Further, referring to FIG. 5, the height of the second gate trench 112 formed by removing the second dummy gate 102 may also be obviously lower than the heights of the first Al gate 110 and the portion of the silicon oxide layer 105 around the first Al gate 110. When a CMP process is used to polish the second Al layer 114 until the surface of the silicon oxide layer 105 is exposed, the CMP process may be stopped. Referring to FIG. 7, the second gate trench 112 is filled with the second Al layer 114 to form the second Al gate 115. At the same time, residual second Al layer (not labeled) may be formed on the silicon oxide layer 105 around the second Al gate 115. That is, the residual second Al layer may be formed in the polishing dishes. When a voltage is applied on the subsequently formed transistors, the residual second Al layer formed on the silicon oxide layer 105 may cause the second Al gate 115 to be shorted. For example, if a plurality of the second Al gates 115 are formed in the PMOS region II, adjacent second Al gates 115 may be connected by the residual second Al layer formed on the silicon oxide layer 105. Thus, the adjacent second Al gates 115 may have a short circuit issue. Therefore, the performance of the PMOS transistors may not match the desired requirements; and may fail under certain circumstances.

Figure 16:
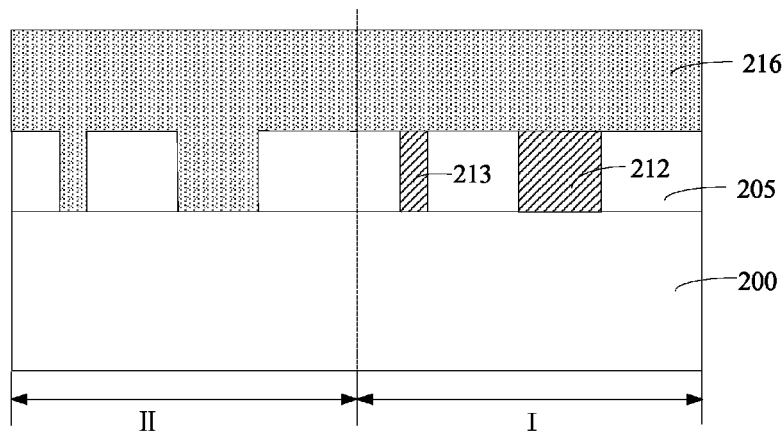
Figure 17:
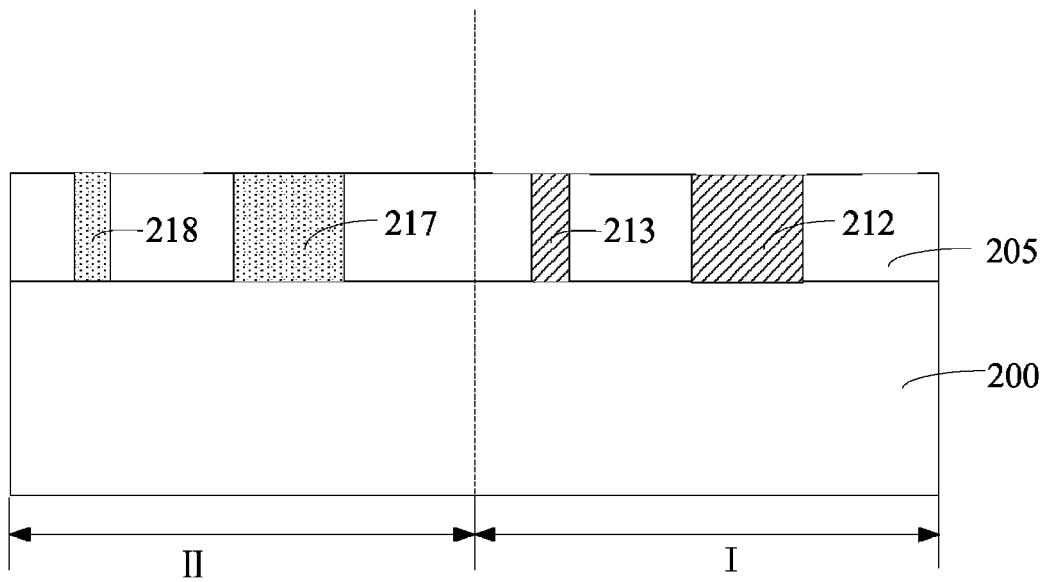
Figure 18:
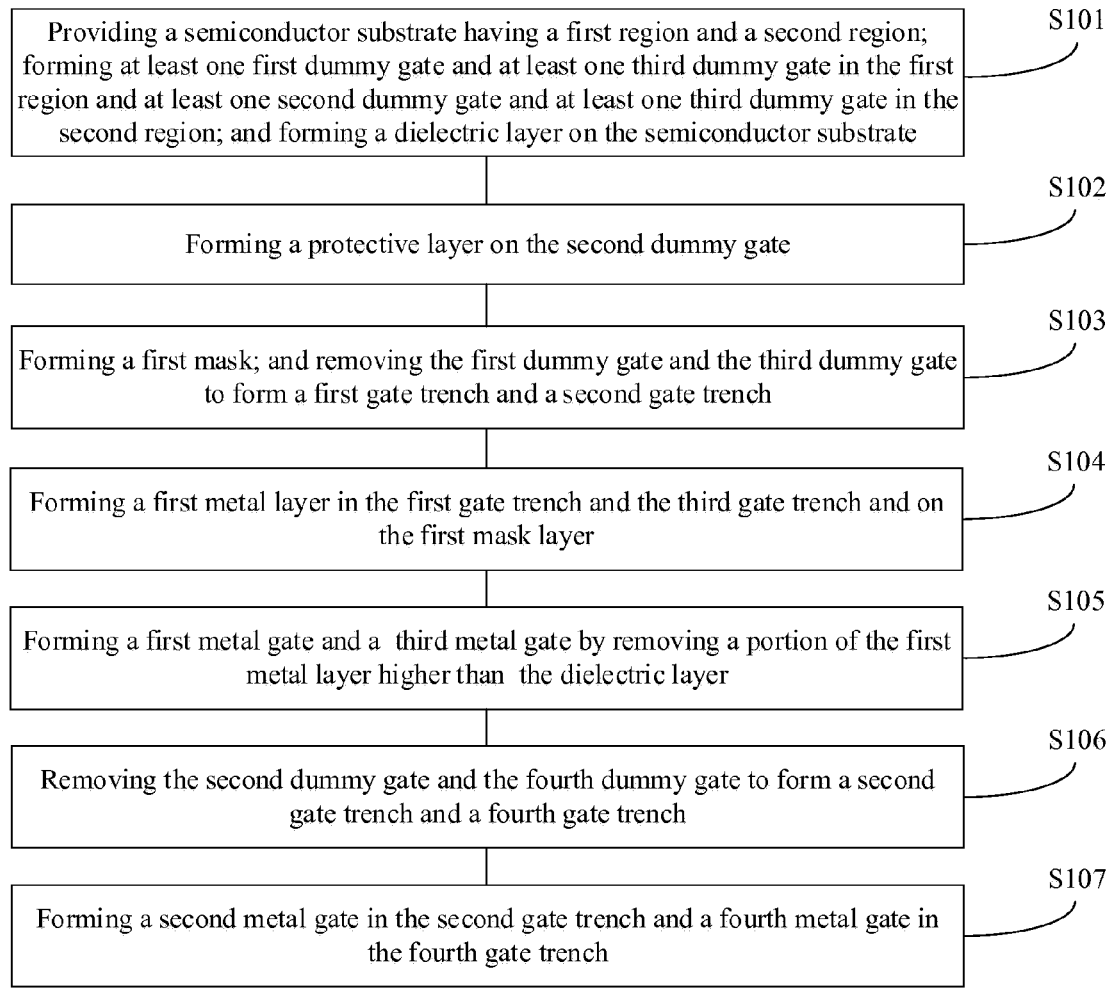
FIG. 18 illustrates an exemplary fabrication process of a semiconductor device consistent with the disclosed embodiments.

FIG. 18 illustrates an exemplary fabrication process of a semiconductor device consistent with the disclosed embodiments; and FIGS. 8~17 illustrate exemplary semiconductor structures corresponding to various stages of the fabrication process.

Figure 8:
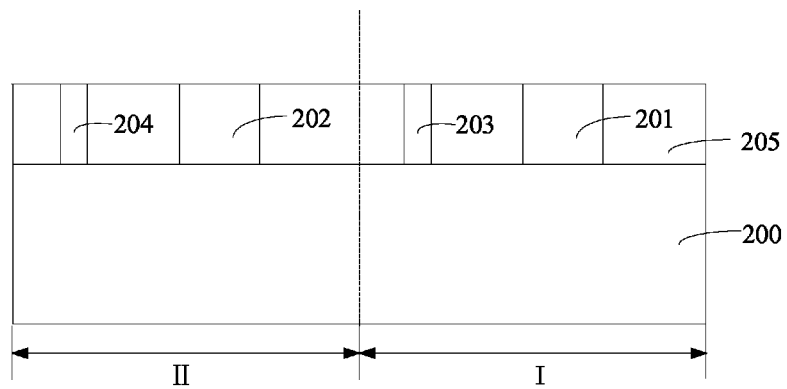
FIGS. 8~17 illustrate semiconductor structures corresponding to certain stages of an exemplary fabrication process of a semiconductor device consistent with the disclosed embodiments.

As shown in FIG. 18, at the beginning of the fabrication process, a substrate with certain structures is provided (S101). FIG. 8 illustrates a corresponding semiconductor structure.

As shown in FIG. 8, a semiconductor substrate 200 is provided. The semiconductor substrate 200 may have a first region I and a second region II. The type of the first region I may be different from the type of the second region II. Further, at least one first dummy gate 201 and at least one third dummy gate 203 may be formed on the surface of the semiconductor substrate 200 in the first region I. Further, at least one second dummy gate 202 and at least one fourth dummy gate 204 may be formed on the surface of the semiconductor substrate 200 in the second region II. Further, the critical dimension (CD) of the second dummy gate 202 may be equal to, or greater than 0.1 µm. Other CDs may also be used.

The semiconductor substrate 200 may include any appropriate semiconductor materials, such as silicon, silicon on insulator (SOI), silicon germanium, germanium on insulator (GOI), carborundum, indium antimonite, lead telluride, indium arsenide, indium phosphide, gallium arsenide, gallium nitride, gallium antimonite, alloy semiconductor, or a combination thereof. The semiconductor substrate 200 may also be a glass substrate or a diamond substrate, etc. The semiconductor substrate 200 provides a base for subsequent processes and structures.

In one embodiment, the semiconductor substrate 200 is silicon, and a plurality of isolation structures (not shown) may be formed in the surface of the semiconductor substrate 200. The isolation structures may be used to electrically isolate adjacent device structures and/or active regions. The isolation structures may be shallow trench isolation (STI) structures, or other appropriate isolation structures, etc.

The first region I and the second region II may be any appropriate type of regions. In one embodiment, the first region I is a PMOS region; and the second region II is an NMOS region. The first dummy gate 201 and the third dummy gate 203 in the first region I, and the second dummy gate 202 and the fourth dummy gate 204 in the second region II may be formed simultaneously. In certain other embodiments, the first dummy gate 201, the second dummy gate 202, the third dummy gate 203 and the fourth dummy gate 204 may be formed separately.

The first dummy gate 201, the second dummy gate 202, the third dummy gate 203, and the fourth dummy gate 204 may be made of any appropriate material. In one embodiment, the first dummy gate 201, the second dummy gate 202, the third dummy gate 203, and the fourth dummy gate 204 are made of polysilicon.

In one embodiment, the CD of the first dummy gate 201 may be equal to, or greater than approximately 0.1 µm. The CD of the fourth dummy gate 204 may be smaller than approximately 0.1 µm. Further, the CDs of the first dummy gate 201, the second dummy gate 202, the third dummy gate 203, and the fourth dummy gate 204 may be all smaller than, or equal to 2 µm.

Referring to FIG. 8, for illustrative purposes, the CD of the first dummy gate 201 and the CD of the second dummy gate 202 may be identical; and the CD of the third dummy gate 203 may be identical to the CD of the fourth dummy gate 204. In certain other embodiments, the CD of the first dummy gate 201 may be different from the CD of the second dummy gate 202; and the CD of the third dummy gate 203 may be different from the CD of the fourth dummy gate 204, as long as the CDs of the first dummy gate 201, the second dummy gate 202, the third dummy gate 203, and the fourth dummy gate 204 are smaller than, or equal to 2 µm.

In one embodiment, a first gate dielectric layer (not shown) may be formed between the first dummy gate 201 and the semiconductor substrate 200; a second gate dielectric layer (not shown) may be formed between the second dummy gate 202 and the semiconductor substrate 200; a third gate dielectric layer (not shown) may be formed between the third dummy gate 203 and the semiconductor substrate 200; and a fourth gate dielectric layer (not shown) may be formed between the fourth dummy gate 204 and the semiconductor substrate 200. The first gate dielectric layer, the second gate dielectric layer, the third gate dielectric layer, and the fourth gate dielectric layer may be made of high dielectric constant (high-K) material. The high-K material may be one or more of $HfO_2$, $Al_2O_3$, $ZrO_2$, HfSiO, HfSiON, HfTaO, or HfZrO, etc. The first gate dielectric layer, the second gate dielectric layer, the third gate dielectric layer and the fourth gate dielectric layer made of the high-K material may be able to increase the electrical isolation effect; reduce the leakage current; and improve the device performance. In certain other embodiments, the first gate dielectric layer, the second gate dielectric layer, the third gate dielectric layer and the fourth gate dielectric layer may be made of silicon oxide.

In one embodiment, sidewall spacers (not shown) may be formed around the first dummy gate 201, the second dummy gate 202, the third dummy gate 203, and the fourth dummy gate 204. The sidewall spacers may be a single layer structure made of silicon oxide, or silicon nitride, etc. The sidewall spacers may also be a multiple-stacked structure, such as silicon oxide-silicon nitride-silicon oxide, etc. The sidewall spacers may be used to define the distance between the source region and the drain region. The sidewall spacers may also be used to define the distance between the source region and the gate. After forming the sidewall spacers, a doping process may be performed on the semiconductor substrate 200 at both sides of the sidewall spacers to form the source/drain regions. The sidewall spacers may be used as a mask of the doping process.

In certain other embodiments, a contact etching stop layer (CESL, not shown) may be formed on the surface of the semiconductor substrate 200 and the side surfaces of the sidewall spacers. A subsequent etching process may be used to formed contact via through holes on the source/drain regions. The CESL may be used to protect the semiconductor substrate 200 from being damaged by the etching process. The contact via through holes may be stopped at the CESL. Thus, the surface of the semiconductor substrate 200 under the CESL may not be damaged by the etching process. Further, when the contact via through holes are stopped at the CESL, the CESL may not be overly etched. Thus, the height of the contact via through holes on the source regions and the height of the contact via through holes on the drain regions may be identical.

The CESL may be made of any appropriate material. In one embodiment, the CESL is made of silicon nitride. Various processes may be used to form the CESL, such as a chemical vapor deposition (CVD) process, a physical vapor deposition (PVD) process, or an atomic layer deposition process (ALD), etc.

Further, referring to FIG. 8, a dielectric layer 205 may be formed on the semiconductor substrate 200. The top surface of the dielectric layer 205 may level with the top surfaces of the first dummy gate 201, the second dummy gate 202, the third dummy gate 203, and the fourth dummy gate 204.

A process for forming the dielectric layer 205 may include forming a dielectric material layer (not labeled) to cover the semiconductor substrate 200, the top surfaces of the first dummy gate 201, the second dummy gate 202, the third dummy gate 203, and the fourth dummy gate 204; and followed by removing a portion of the dielectric material layer higher than the top surfaces of the first dummy gate 201, the second dummy gate 202, the third dummy gate 203, and the fourth dummy gate 204. Thus, the dielectric layer 205 may be formed. Further, the top surfaces of the first dummy gate 201, the second dummy gate 202, the third dummy gate 203, and the fourth dummy gate 204 may be exposed.

The dielectric material layer may be made of any appropriate material, such as silicon oxide, silicon nitride, or silicon oxynitride, etc. Various processes may be used to form the dielectric material layer, such as a CVD process, a PVD process, an FCVD process, or a high-aspect-ratio process (HARP). In one embodiment, the dielectric material layer is formed by a HARP. The HARP may have a desired filling ability. Thus, the filling effect of the dielectric layer 205 may be improved. The portion of the dielectric material layer higher than the top surfaces of the first dummy gate 201, the second dummy gate 202, the third dummy gate 203, and the fourth dummy gate 204 may be removed by any appropriate process, such as a chemical mechanical polishing (CMP) process, a physical mechanical polishing process, an ion beam polishing process, or an etching process, etc.

Figure 9:
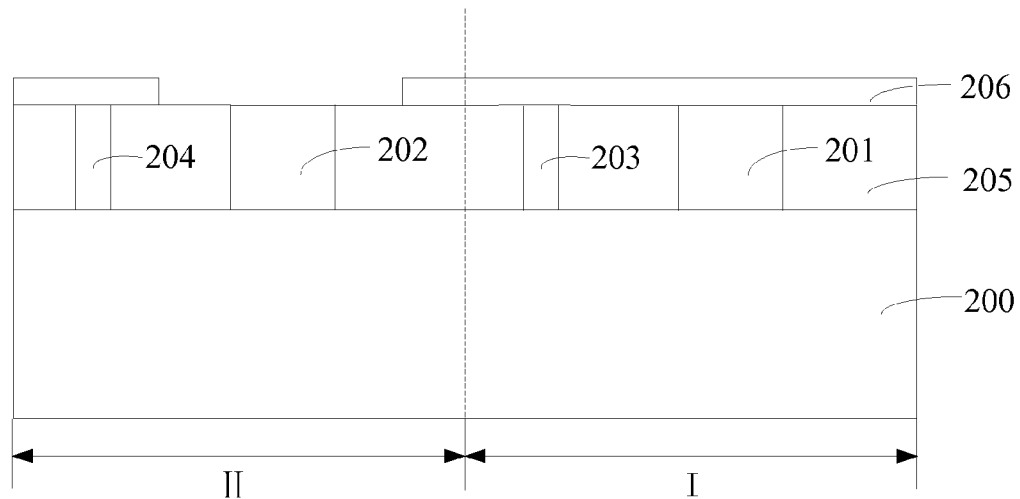
Figure 10:
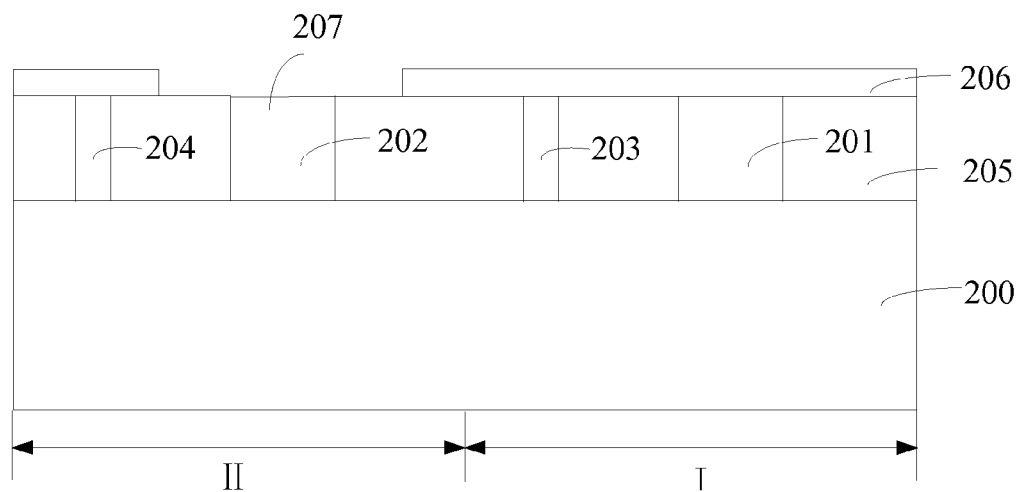
Figure 11:
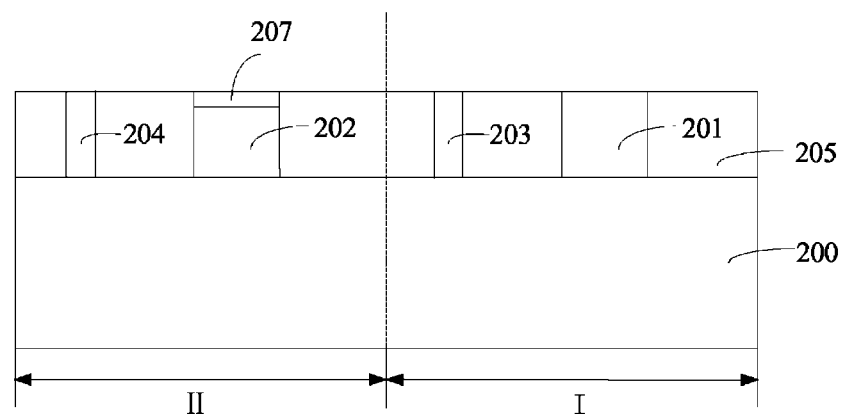

Returning to FIG. 18, after forming the dielectric layer 205, a protective layer may be formed on the second dummy gate 202 (S102). FIGS. 9~11 illustrate semiconductor structures corresponding to certain stages of a process for forming the protective layer.

As shown in FIG. 9, after forming the dielectric layer 205, a first mask layer 206 may be formed on the surface of the dielectric layer 205, the first dummy gate 201, the third dummy gate 203, and the fourth dummy gate 204. The first mask layer 206 may expose the top surface of the second dummy gate 202. The exposing size of the first mask layer 206 may be greater than approximately 0.1 µm; or greater than the size of the second dummy gate 202. Thus, the subsequently formed protectively layer may cover the entire top surface of the second dummy gate 202.

The first mask layer 206 may be a single layer structure made of photoresist, etc. The first mask layer may also be a multiple-layer structure include a patterned layer, a dielectric anti-reflection coating (DARA), and a photoresist layer from the bottom to the top. The first mask layer 206 may be used as a mask for subsequently forming a protective layer.

Further, as shown in FIG. 10, after forming the first mask layer 206, a protective layer 207 is formed on the top surface of the second dummy gate 202. The protective layer 207 may be formed by any appropriate process, such as a CVD process, an atomic layer deposition (ALD) process, or an oxidation process, etc. In one embodiment, the protective layer 207 is formed by an oxidation process. That is, the protective layer 207 may be formed by oxidizing the top surface of the second dummy gate 202. The oxidation process may be a thermal oxidation process, or a chemical oxidation process, etc.

In one embodiment, the protective layer 207 is formed by a thermal oxidation process using a conventional high temperature tube furnace, or a single wafer reaction chamber. The oxidation temperature may be lower than approximately 500° C. In certain other embodiment, the oxidation temperature may be in a range of approximately 700° C.~800° C. The oxidation gas may be $O_2$, or $N_2O$, etc. The oxidation gas may also be a mixture of $H_2O$ and $O_2$, etc. The pressure of the thermal oxidation process may be in a range of approximately 5 Torr~800 Torr. In certain other embodiments, an inert gas, such as $N_2$ or He, etc., may be used to dilute the oxidation gas.

In one embodiment, the thermal oxidation process is a wet oxygen oxidation process using a mixture of $H_2O$ and $O_2$, e.g., in a water environment. The wet oxygen oxidation process may be easily controlled; and the thickness of the protective layer 207 may be significantly precise. The oxidation temperature is lower than approximately 500° C. Such a temperature may prevent the doping ions in the source/drain regions from having a significantly large diffusion. Thus, it may prevent the increasing of the leakage current. Further, metal silicide layers may be formed on the source/drain regions before forming the CESL and after forming the source/drain regions, such a temperature may avoid the melting of the metal silicide.

The thickness of the protective layer 207 may be in a range of approximately 20 Å~300 Å. If the protective layer 207 is significantly thick, it may be difficult to subsequently remove the second dummy gate 202 under the protective layer 207 to form a second gate trench. If the protective layer 207 is substantially thin, the protective layer 207 may be unable to protect the second dummy gate 202 during the subsequent polishing process.

Further, as shown in FIG. 11, after forming the protective layer 207, the first mask layer 206 may be removed. Various processes may be used to remove the first mask layer 206, such as a dry etching process, or a wet etching process, etc. In one embodiment, the first mask layer 206 is removed by a plasma ashing process.

Figure 12:
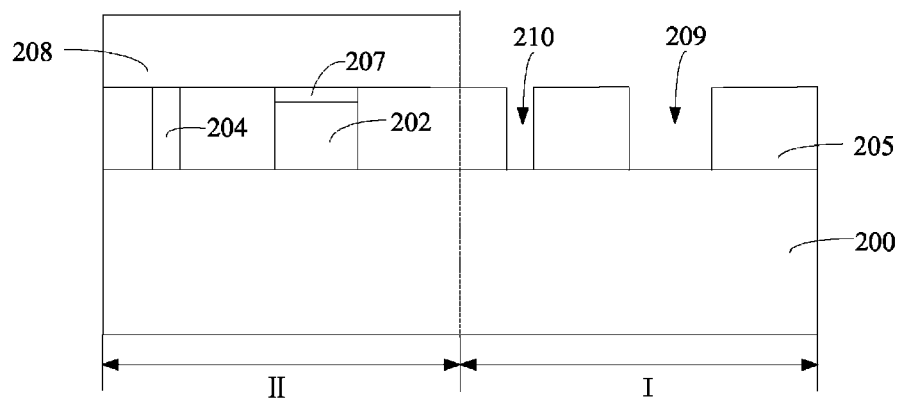

Returning to FIG. 18, after forming the protective layer 207, a second mask layer may be formed; and the first dummy gate 201 and the third dummy gate 203 may be removed (S103). FIG. 12 illustrates a corresponding semiconductor structure.

As shown in FIG. 12, a second mask layer 208 is formed on the dielectric layer 205, the fourth dummy gate 204, and the protective layer 207 in the second region II. The second mask layer 208 may be used to protect the second dummy gate 202 and the fourth dummy gate 204 from being damaged by a subsequent process for removing the first dummy gate 201 and the third dummy gate 203.

Further, as shown in FIG. 12, the first dummy gate 201 is removed; and a first gate trench 209 is formed. The third dummy gate 203 is removed; and a third gate trench 210 is formed. The first gate trench 209 and the third gate trench 210 may be used to subsequently form a first metal gate and a third metal gate, respectively. The bottom of the first gate trench 209 and the bottom of the third gate trench 210 may expose the gate dielectric layer (not shown). The first dummy gate 201 and the third dummy gate 203 may be removed by any appropriate process, such as a dry etching process, or a wet etching process, etc.

The second mask layer 208 may be made of any appropriate material, such as silicon oxide, silicon nitride, photoresist, boron nitride, titanium nitride, or other appropriate hard material layer. In one embodiment, the second mask layer 208 is made of boron nitride or titanium nitride. The second mask layer 208 made of boron nitride or titanium nitride may have a significantly high polishing selectivity with the dielectric layer 205. Thus, a subsequent polishing process for forming a first metal gate and a second metal gate may not overly polish the dielectric layer 205. Further, the subsequently polishing process for forming the first metal gate and the second metal gate may remove the second mask layer 208 simultaneously. Thus, an extra process for removing the second mask layer 208 may not be necessary; and a process step may be saved.

Figure 13:
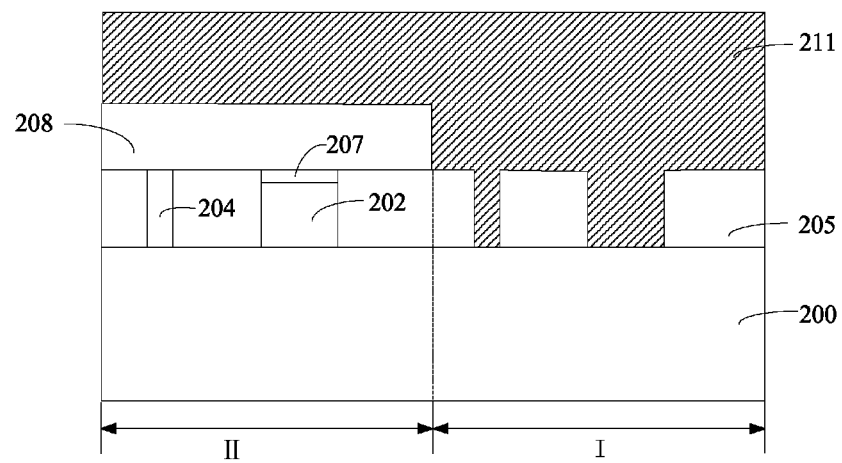

Returning to FIG. 18, after forming the first gate trench 209 and the third gate trench 210, a first metal layer may be formed (S104). FIG. 13 illustrates a corresponding semiconductor structure.

As shown in FIG. 13, a first metal layer 211 is formed. The first metal layer 211 may fill the first gate trench 209 and the third gate trench 210. The first metal layer 211 may also cover the second mask layer 208. The first metal layer 211 may be used to subsequently form a first metal gate and a third metal gate.

The first metal layer 211 may be made of any appropriate material, such as W, Cu, Al, Ag, or Au, etc. In one embodiment, the first metal layer 211 is made of Al. Various processes may be used to form the first metal layer 211, such as a CVD process, a PVD process, a sputtering process, or an electroplating process, etc.

Figure 14:
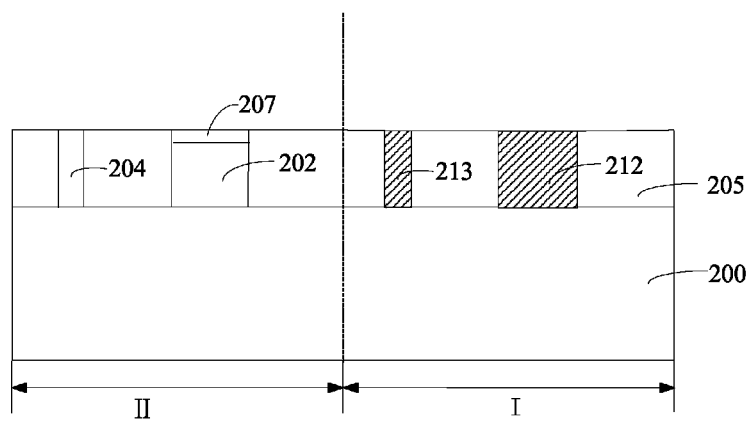

Returning to FIG. 18, after forming the first metal layer 211, a first metal gate and a third metal gate may be formed (S105). FIG. 14 illustrates a corresponding semiconductor structure.

As shown in FIG. 14, the second mask layer 208 and a portion of the first metal layer 211 higher than the dielectric layer 205 are removed; and a first metal gate 212 and a third metal gate 213 are formed. The portion of the first metal later 211 higher than the dielectric layer 205 may be removed by any appropriate process, such as a CMP process, or a physical mechanical polishing process, etc. In one embodiment, the portion of the first metal layer 211 higher than the dielectric layer 205 is removed by a CMP process. The polishing slurry may include any appropriate particles, such as aluminum oxide particles, silicon oxide particles, or diamond particles, etc. In one embodiment, the polishing slurry includes aluminum oxide particles. During the CMP process for removing the portion of the first metal layer 211 higher than the dielectric layer 205, the second mask layer 208 may be removed simultaneously.

In one embodiment, the CMP process may be performed until the dielectric layer 205 is exposed. Since the CD of the fourth dummy gate 204 may be smaller than 0.1 μm, the polishing slurry of the CMP process may have a substantially small over polishing to the fourth dummy gate 204. However, the CD of the second dummy gate 202 may be greater than or equal to 0.1 μm, the polishing slurry of the CMP process may have a significantly severe over polishing to the second dummy gate 202 made of polysilicon. By forming the protective layer 207 on the second dummy gate 202 by oxidizing a top portion of the second dummy gate 202, the remaining second dummy gate layer 202 may be protected by the protective layer 207. Thus, the remaining second dummy gate 202 may not contact with the polishing slurry, and the over polishing on the remaining second dummy gate 202 may be avoided. Therefore, the polishing dishes caused by the over polishing of the CMP process may be avoided being formed on the dielectric layer 205.

Figure 15:
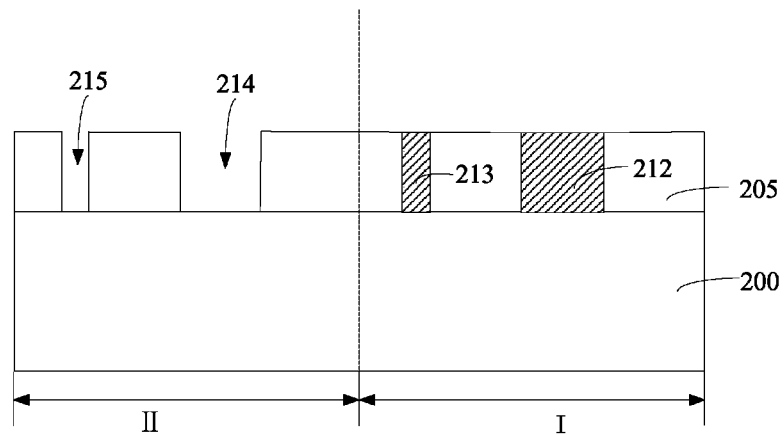

Returning to FIG. 18, after forming the first metal gate 212 and the third metal gate 213, the second dummy gate 202 and the fourth dummy gate 204 may be removed (S106). FIG. 15 illustrates a corresponding semiconductor structure.

As shown in FIG. 15, the protective layer 207, the second dummy gate 202 and the fourth dummy gate 204 are removed. Correspondingly, a second gate trench 214 and a fourth gate trench 215 are formed in the dielectric layer 205 in the second region II, respectively. The bottom of the second gate trench 214 and the bottom of the fourth gate trench 215 may expose the high-K gate dielectric layer (not shown).

The protective layer 207, the second dummy gate 202, and the fourth dummy gate 204 may be removed by any appropriate process, such as a dry etching process, or a wet etching process, etc. In one embodiment, a plasma dry etching process is used to remove the protective layer 207, the second dummy gate 202, and the fourth dummy gate 204. The pulse power of the radio frequency power source of the plasma dry etching process may be in a range of approximately 350 W~450 W. The etching gas may include one or more of $Cl_2$, HBr, He, $O_2$, or Ar, etc. The flow rate of $Cl_2$ may be in a range of approximately 10 sccm~20 sccm. The flow rate of HBr may be in a range of approximately 90 sccm~120 sccm. The flow rate of He may be in a range of approximately 8 sccm~12 sccm. The flow rate of $O_2$ may be in a range of approximately 4 sccm~5 sccm. The flow rate of Ar may be in a range of approximately 120 sccm~140 sccm. The etching time may be in a range of approximately 8 s~10 s.

The plasma dry etching process with above described parameters may be able to remove the protective layer 207, the second dummy gate 202, and the fourth dummy gate 204 simultaneously; and the completeness of the removing process may be ensured. Thus, an extra process for removing the protective layer 207 may be unnecessary; and a process step may be saved.

In certain other embodiments, the etching gas may be fluoride-based gas, such as one or more of $CF_4$, $CHF_3$, or $CH_2F_2$, etc. The diluting gas may be one or more of He, $N_2$, or $O_2$, etc.

Returning to FIG. 18, after forming the second gate trench 214 and the fourth gate trench 215, a second metal gate and a fourth metal gate may be formed (S107). FIGS. 16~17 illustrate semiconductor structures corresponding to certain stages of a fabrication process of the second metal gate and the fourth metal gate.

As shown in FIG. 16, after forming the second gate trench 214 and the fourth gate trench 215, a second metal layer 216 is formed. The second metal layer 216 may fill the second trench 214 and the fourth trench 215. Further, the second metal layer 216 may also be formed on the dielectric layer 205 in the first region I, the first metal gate 212, and the third metal gate 213.

The second metal layer 216 may be made of any appropriate material, such as Al, W, Ag, Cu, or Au, etc. In one embodiment, the second metal layer 216 is made of Al. Various processes may be used to form the second metal layer 216, such as a CVD process, a PVD process, an FCVD process, a sputtering process, or an electroplating process, etc.

Further, as shown in FIG. 17, after forming the second metal layer 216, a portion of the second metal layer 216 higher than the dielectric layer 205 may be removed; and the second metal gate 217 and the fourth metal gate 218 may be formed. The top surface of the second metal gate 217 and the top surface of the fourth metal gate 218 may level with the top surface of the dielectric layer 205.

The portion of the second metal layer 216 higher than the dielectric layer 205 may be removed by any appropriate process, such as a CMP process, a physical mechanical polishing process, or an etching process, etc. In one embodiment, a CMP process is used to remove the portion of the second metal layer 216 higher than the dielectric layer 205 to form the second metal gate 217 and the fourth metal gate 218.

In one embodiment, during the process for removing the portion of the first metal layer 211 higher than the dielectric layer 205, the protective layer 207 may protect the remaining second dummy gate 202 under the protective layer 207. Thus, the damage to the second dummy gate 202 may be significantly reduced. Therefore, comparing with the heights of the first metal gate 212, the second metal gate 213 and the surrounding dielectric layer 205 in the first region I, the height of the second dummy gate 202 in the second region II may barely be changed after the CMP process. Thus, the height of the dielectric layer 205 around the second dummy gate 202 may be identical to the height of the dielectric layer 205 in the first region I. That is, no polishing dishes may be formed on the dielectric layer 205 in the second region II. After removing the portion of the second metal layer 216 higher than the dielectric layer 205, the possible residues of the second metal layer 216 may not be formed on the surface of the dielectric layer 205. Thus, the performance of the subsequently formed transistors in the second region II may be improved; and the properties of the subsequently formed semiconductor devices may be enhanced. For example, when a plurality of the second dummy gates 202 are formed in the second region II, the short circuit issue between adjacent second metal gates 217 may be avoided.

In one embodiment, referring to FIG. 12~13, a first work function layer (not shown) may be formed in the first gate trench 209 and the third gate trench 210 before filling the first metal layer 211 into the first gate trench 209 and the third gate trench 210. Further, referring to FIGS. 13~14, a second work function layer (not shown) may be formed in the second gate trench 214 and the fourth gate trench 215 before filling the second metal layer 216 into the second gate trench 214 and the fourth gate trench 215.

The first work function layer may be used to adjust the threshold voltage of the subsequently formed PMOS transistors. For the work function of PMOS transistors, a lower work function may indicate that the PMOS transistors may have a lower threshold voltage. The second work function layer may be used to adjust the threshold voltage of the subsequently formed NMOS transistors. For the work function of the NMOS transistors, a higher work function may indicate that the NMOS transistors may have a lower threshold voltage. Thus, the first work function layer and the second work function layer may have to be made of different materials. For examples, the first work function layer may be made of TiN, TiAlN, or TiSiN, etc.; and the second work function layer may be made of Ti, TiAl, Pt, W, Co or Ru, etc.

It may need precisely control the thicknesses of the first work function layer and the second work function layer in order to precisely control the work function of the PMOS transistors and the work function of the NMOS transistors. For the first dummy gate 201, the second dummy gate 202, the third dummy gate 203 and the fourth dummy gate 204 with CDs smaller than approximately 2 μm, it may need to form the first work function layer in the first gate trench 209 and the third gate trench 210 in the first regions I firstly. Then, the second work function layer may be formed in the second gate trench 214 and the fourth gate trench 215 by a subsequent process.

The CDs of the first dummy gate 201, the second dummy gate 202, the third dummy gate 203, and the fourth dummy gate 204 may be relatively small. Further, the height-to-width ratios the first gate trench 209, the second gate trench 214, the third gate trench 210 and the fourth gate trench 215 may be relatively large. If the second work function layer is directly formed in the second gate trench 214 and the fourth gate trench 215, due to the characteristic of the material of the second work function layer, the second work function layer may be unable to be formed in the second gate trench 214 and the fourth gate trench 215. However, the first work function layer may be able to be formed in the first gate trench 209 and the third gate trench 210 due to the characteristic of the material of the first work function layer.

Thus, in one embodiment, according to the characteristics of the first work function layer and the second work function layer, it may need form the first gate trench 209 and the third gate trench 210 in the dielectric layer 205 firstly. Then, the first work function layer may be formed in the first gate trench 209 and the third gate trench 210. Further, the first metal layer 211 may be formed on the first work function layer. The first metal layer 211 may fill the first gate trench 209 and the third gate trench 210; and may also cover the second mask layer 208. Further, the first metal layer 211 higher than the dielectric layer 205 may be removed by a CMP process. In order to entirely remove the possible residue of the first metal layer 211 on the dielectric layer 205, the dielectric layer 205 may be slightly over-etched. Thus, the height-to-width ratios of the second gate trench 214 and the fourth gate trench 215 may be slightly reduced. The over-etching of the dielectric layer 205 may also cause the heights of the subsequently formed first metal gate 212, the second metal gate 217, the third metal gate 213 and the fourth metal gate 218 to be slightly reduced, but the scale of the over-etching may be in an acceptable region. Thus, it may not affect the performance of the subsequently formed semiconductor devices. The reduced heights of the second gate trench 214 and the fourth gate trench 215 may significantly reduce the difficulty for forming the second work function layer in the second gate trench 214 and the fourth gate trench 215. Thus, it may be able to form the second work function layer in the second gate trench 214 and the fourth gate trench 215.

Therefore, in one embodiment, the first region I may have to be a PMOS region; and the second region II may have to be an NMOS region. If the second work function layer is formed in the second gate trench 214 and the fourth gate trench 215 firstly, because the depth-to-width ratio of the of the second gate trench 214 and the fourth gate trench 215 may be significantly large, it may be unable to form the second work function layer in the second gate trench 214 and the fourth gate trench 215 because of the characteristic of the material of the second work function layer. Thus, the performance of the subsequently formed NMOS transistor may be significantly affected.

In certain other embodiments, the CDs of the first dummy gate 201, the second dummy gate 202, the third dummy gate 203 and the fourth dummy gate 204 may be other appropriate value. Once the CDs of the first dummy gate 201, the second dummy gate 202, the third dummy gate 203 and the fourth dummy gate 204 are smaller, or equal to approximately 2 μm, it may need forming the first work function layer in the first gate trench 209 and the third gate trench 210 in the PMOS region firstly. Then, the second work function layer may be formed in the second gate trench 214 and the fourth gate trench 215.

In certain other embodiments, if the CDs of the first dummy gate, the second dummy gate, the third dummy gate, and the fourth dummy gate are all greater than approximately 2 μm. The height-to-width ratios of the second gate trench and the fourth gate trench may match the requirements for forming the second work function layer in the second gate trench and the fourth gate trench. Thus, the second work function layer may be formed in the second gate trench and the fourth gate trench in the NMOS region firstly. Then, the first work function layer may be formed in the first gate trench and the third gate trench in the PMOS region. That is, the first region may be the PMOS region and the second region may be the NMOS region. Or, the first region may be the NMOS region and the second region may be the PMOS region.

In certain other embodiments, if the CD of the fourth dummy gate 204 is equal to or greater than 0.1 μm, the protective layer 207 may also be formed on the top surface of the fourth dummy gate 204 simultaneously. That is, if the second dummy gate 202 and the fourth dummy gate 204 in the second region all have relatively large CDs, the second mask layer 208 may be omitted. The protective layer 207 may protect the second dummy gate 202 and the fourth dummy gate 204 from being damaged during the process for removing the first dummy gate 201 and the third dummy gate 203.

Thus, a semiconductor device may be formed by the above disclosed processes and methods; and the corresponding device is illustrated in FIG. 17. As shown in FIG. 17, the semiconductor device includes a semiconductor substrate 200 having a first region I and a second region II. The semiconductor device also includes a dielectric layer 205 formed on the surface of the semiconductor substrate 200. Further, the semiconductor device includes at least one first metal gate 212 and at least one third metal gate 213 formed on the semiconductor substrate 200 in the first region I and in the dielectric layer 205 in the first region I. Further, the semiconductor device also includes at least one second metal gate 217 and at least one fourth metal gate 218 formed on the semiconductor substrate 200 in the second region II and in the dielectric layer 205 in the second region II. The detailed structures and intermediate structures are described above with respect to the fabrication processes.

Therefore, according to the disclosed processes and device structures, a protective layer may be formed on the second dummy gate with a relatively large CD in the second region of the semiconductor substrate by oxidizing a top portion of the second dummy gate. The protective layer may protect the remaining second dummy gate from being damaged by the polishing process for forming a first metal gate and a third metal gate on the semiconductor substrate in the first region. Thus, polishing dishes may not be formed on the surface of the dielectric layer formed on the surface of the semiconductor substrate. Therefore, the metal residues may not be formed on the surface of the dielectric layer; and the performance of the subsequently formed semiconductor devices may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A semiconductor device, comprising:
   a semiconductor substrate having a first region and a second region;
   at least one first metal gate formed on a surface of the semiconductor substrate in the first region;

at least one second metal gate formed on the surface of the semiconductor substrate in the first region;
at least one first dummy gate formed on a surface of the semiconductor substrate in the second region;
at least one second dummy gate formed on the surface of the semiconductor substrate in the second region;
a protective layer formed on the first dummy gate;
a dielectric layer with a top surface level with top surfaces of the first metal gate, the second metal gate, the second dummy gate, and the protective layer formed on the first dummy gate.

2. The semiconductor device according to claim 1, wherein:
the dielectric layer is made of silicon oxide, silicon nitride, or silicon oxynitride.

3. The semiconductor device according to claim 1, wherein:
a thickness of the protective layer is in a range of approximately 20 Å~300 Å.

4. The semiconductor device according to claim 1, wherein:
a critical dimension of the first dummy gate is equal to or greater than approximately 0.1 μm and smaller than, or equal to approximately 2 μm.

5. The semiconductor device according to claim 4, wherein:
the first region is a PMOS region; and
the second region is an NMOS region.

6. The semiconductor device according to claim 1, wherein:
the first dummy gate is made of polysilicon; and
the protective layer is made of silicon oxide.

7. The semiconductor device according to claim 1, wherein:
a thickness of the protective layer is in a range of approximately 20 Å~300Å.

8. The semiconductor device according to claim 1, wherein:
when a critical dimension of at least one of the first metal gate and the first dummy gate is equal to, or smaller than approximately 2 μm, the first region is a PMOS region and the second region is an NMOS region.

* * * * *